(12) United States Patent  (10) Patent No.: US 8,193,098 B2
Nakamura  (45) Date of Patent: Jun. 5, 2012

(54) METHOD FOR MANUFACTURING SEMICONDUCTOR DEVICE

(75) Inventor: Tomoyuki Nakamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 157 days.

(21) Appl. No.: 12/700,957

(22) Filed: Feb. 5, 2010

(65) Prior Publication Data

US 2010/0210082 A1   Aug. 19, 2010

(30) Foreign Application Priority Data

Feb. 16, 2009 (JP) ................................. 2009-032716

(51) Int. Cl.
 *H01L 21/302* (2006.01)
 *H01L 21/461* (2006.01)

(52) U.S. Cl. ................................. 438/710; 257/E21.218

(58) Field of Classification Search .................. 438/710, 438/734, 453, 678, 679, 253; 257/E21.218
See application file for complete search history.

(56) References Cited

U.S. PATENT DOCUMENTS

| 6,214,661 | B1 * | 4/2001 | Lee et al. ....................... 438/240 |
| 2006/0151845 | A1 * | 7/2006 | Govindarajan ................ 257/411 |
| 2009/0127603 | A1 * | 5/2009 | Yamakawa et al. ................ 438/3 |
| 2009/0130457 | A1 * | 5/2009 | Kim et al. ...................... 428/432 |
| 2010/0099264 | A1 * | 4/2010 | Elers ............................. 438/710 |

FOREIGN PATENT DOCUMENTS

| JP | 05-343254 | 12/1993 |
| JP | 2000-058777 | 2/2000 |
| JP | 2002-314072 | 10/2002 |
| JP | 2004-158487 | 6/2004 |
| JP | 2004-214602 | 7/2004 |
| JP | 2004-304143 | 10/2004 |
| JP | 2005-135914 | 5/2005 |
| JP | 2006-256902 | 9/2006 |
| JP | 2007-043166 | 2/2007 |
| JP | 2007-536733 | 12/2007 |
| JP | 2008-028051 | 2/2008 |
| WO | WO 2005-112095 A1 | 11/2005 |

* cited by examiner

*Primary Examiner* — Walter L Lindsay, Jr.
(74) *Attorney, Agent, or Firm* — McDermott Will & Emery LLP

(57) ABSTRACT

A method for manufacturing a semiconductor device comprises forming a dielectric film, and oxidizing the dielectric film. In oxidizing the dielectric film, an oxidized gas is supplied to the dielectric film at a heat treatment. Supplying the oxidized gas is performed intermittently a plurality of times while the dielectric film is subjected to heat treatment.

20 Claims, 7 Drawing Sheets

METHOD FOR MANUFACTURING SEMICONDUCTOR DEVICE

This application is based upon and claims the benefit of priority from Japanese Patent Application No. 2009-032716, filed on Feb. 16, 2009, the disclosure of which is incorporated herein in its entirety by reference.

BACKGROUND OF THE INVENTION

1. Field of the Invention

The present invention relates to a method for manufacturing a semiconductor device.

2. Description of the Related Art

With the increasing integration degree of semiconductor devices, ensuring an appropriate capacitance value for capacitors in memory devices has been increasingly difficult. To ensure the appropriate capacitance value, high dielectric-constant films comprising dielectrics with high dielectric constants have been developed.

Furthermore, for MOS transistors, efforts have been made to reduce the thickness of a gate insulating film in order to improve driving capability. However, the reduction in the thickness of the gate insulating film involves a disadvantageous increase in gate leakage and is thus limited. Consequently, high dielectric-constant films have been developed which allow an effective film thickness to be reduced without the need to reduce the physical film thickness.

The developed high dielectric-constant films comprise metal oxides such as $HfO_2$, $ZrO_2$, and $Al_2O_3$, oxides such as silicate and aluminate, and ternary oxides such as BST and STO. Related techniques are disclosed in Japanese Patent Laid-Open Nos. 2008-28051 and 2002-314072.

Japanese Patent Laid-Open Nos. 2004-214602 and 2002-314072 disclose methods for suppressing oxidation of a lower electrode. For example, Japanese Patent Laid-Open No. 2004-214602 discloses a method for suppressing oxidation of a lower electrode in an $HfO_2$ film. The method comprises forming, on the lower electrode, a stack structure of an Al-rich $HfO_2$—$Al_2O_3$ mixed film and an Hf-rich $HfO_2$—$Al_2O_3$ mixed film or a stack structure of an $Al_2O_3$ film and an Hf-rich $Al_2O_3$ mixed film to suppress the oxidation of the lower electrode.

SUMMARY OF THE INVENTION

In one embodiment, there is provided a method for manufacturing a semiconductor device, the method comprising:
forming a lower electrode;
forming a dielectric film on the lower electrode;
oxidizing the dielectric film by supplying an oxidized gas to the dielectric film at a heat treatment, supplying the oxidized gas being performed intermittently a plurality of times while the dielectric film is subjected to heat treatment; and
forming an upper electrode on the dielectric film.

In another embodiment, there is provided a method for manufacturing a semiconductor device, the method comprising:
forming a dielectric film on a semiconductor substrate; and
oxidizing the dielectric film by supplying an oxidized gas to the dielectric film at a heat treatment, supplying the oxidized gas being performed intermittently a plurality of times while the dielectric film is subjected to heat treatment.

In the specification, "oxidized gas" refers to a gas with the capability of oxidizing a dielectric film in oxidizing the dielectric film.

In the specification, "inert gas" refers to a gas that does not react with the dielectric film in oxidizing the dielectric film.

In the specification, the phrase "oxidizing the dielectric film by supplying an oxidized gas to the dielectric film at a heat treatment, supplying the oxidized gas being performed intermittently a plurality of times." means that the step of oxidizing the dielectric film by supplying the oxidized gas to the dielectric film is carried out a plurality of times with a step of unoxidizing the dielectric film provided between the steps of oxidizing the dielectric film by supplying the oxidized gas to the dielectric film. For example, the process comprises the step of oxidizing the dielectric film by supplying the oxidized gas to the dielectric film, the step of unoxidizing the dielectric film, the step of oxidizing the dielectric film by supplying the oxidized gas to the dielectric film, the step of unoxidizing the dielectric film, the step of oxidizing the dielectric film by supplying the oxidized gas to the dielectric film, etc.

BRIEF DESCRIPTION OF THE DRAWINGS

The above features and advantages of the present invention will be more apparent from the following description of certain preferred embodiments taken in conjunction with the accompanying drawings, in which.

Figure 1A:
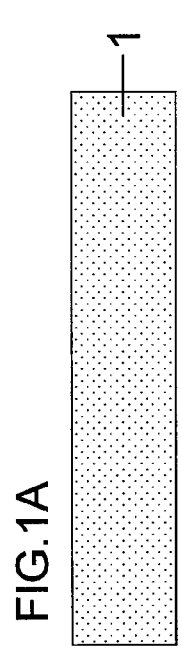
FIG. 1A is a diagram illustrating an example of a method for manufacturing a semiconductor device according to the present invention.

In the drawings, numerals have the following means. 1: lower electrode, 2: dielectric film, 3: upper electrode, 4: capacitor insulating film, 5: second interlayer film, 6: capacitor contact plug, 7: first interlayer film, 8: isolation region, 9: semiconductor substrate, 10: gate insulating film, 11: gate electrode, 12: bit line, 13: bit contact plug, 14: source/drain region

DETAILED DESCRIPTION OF THE PREFERRED EMBODIMENTS

A method for manufacturing a semiconductor device according to the present invention will be described below with reference to the drawings. Exemplary embodiments described below are specific examples shown for deeper understanding of the present invention. The present invention is not limited to the specific examples.

First Exemplary Embodiment

As a first exemplary embodiment, a method for manufacturing a capacitor element that is a semiconductor device will be described. FIGS. 1A to 1D are sectional views showing the method for manufacturing the capacitor element according to the first exemplary embodiment.

First, as shown in FIG. 1A, lower electrode 1 is formed as a first electrode. The lower electrode is formed of a material unlikely to react with a dielectric film and is, for example, Ru. The lower electrode is deposited by, for example, a CVD method.

Figure 1B:
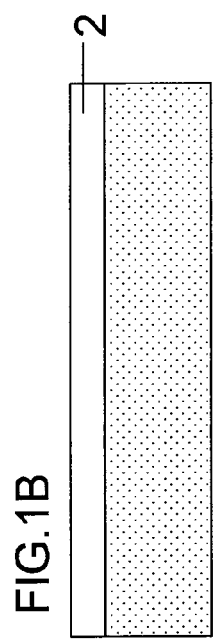
FIG. 1B is a diagram illustrating the example of the method for manufacturing the semiconductor device according to the present invention.

Then, as shown in FIG. 1B, dielectric film 2 is formed on lower electrode 1. Dielectric film 2 is a high dielectric-constant film obtained by depositing STO (Strontium Titanium Oxide). Alternatively, a high dielectric-constant film formed of $HfO_2$ or $ZrO_2$ or a stack film of such high dielectric-constant films may be used. Dielectric film 2 is formed by an ALD method that is excellent in control of film thickness in the formation of a thin film. The temperature at which the dielectric film is grown is such that a precursor is prevented from being thermally decomposed and is, for example, 300° C. An STO film grown at this temperature is amorphous and has a film thickness of, for example, 10 nm.

Figure 1C:
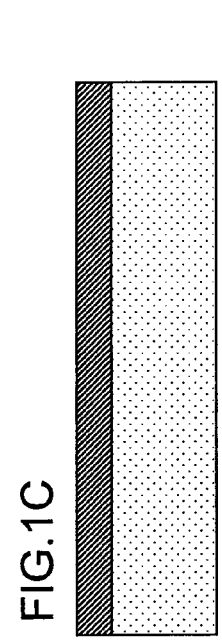
FIG. 1C is a diagram illustrating the example of the method for manufacturing the semiconductor device according to the present invention.

Amorphous STO film 2 has a low relative permittivity. Thus, as shown in FIG. 1C, the permittivity is improved by thermally treating and crystallizing STO film 2 formed into an amorphous state (pre-thermal treatment step). In this case, the crystallization of STO film 2 is promoted at 350° C. or higher. The thermal treatment temperature is, for example, 500° C.

After the crystallization, oxidation treatment in an oxygen atmosphere is carried out intermittently, in order to recover from an oxygen defect present in STO film 2 (thermal treatment step). The oxidation treatment is carried out at, for example, the atmospheric pressure. The crystallization of the STO film also progresses during the oxidation treatment.

For example, a rapid thermal processing (RTP) apparatus is used for the thermal treatment in the pre-thermal treatment step and in the thermal treatment step. The apparatus may be, for example, an ALD apparatus, a CVD apparatus, or an electric furnace.

Figure 2:
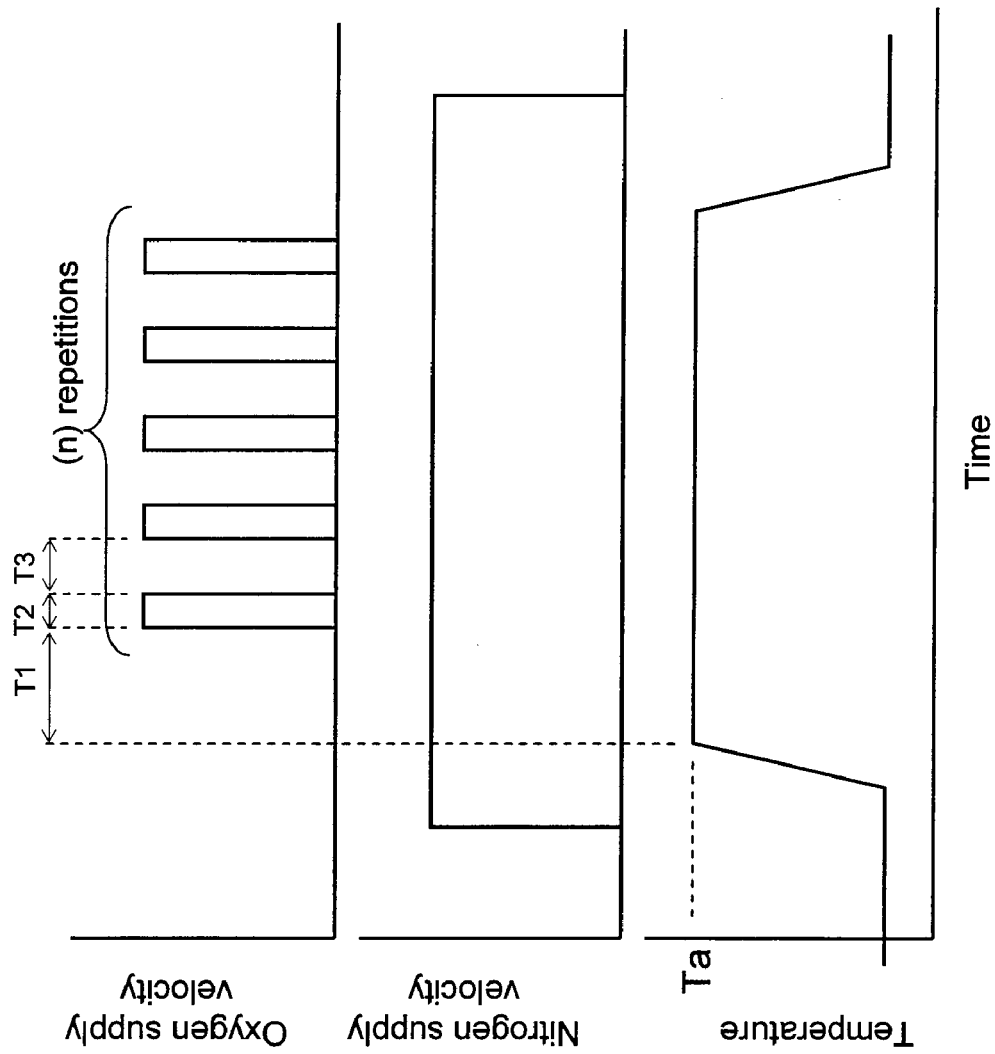
FIG. 2 is a diagram illustrating an example of a step of oxidizing the dielectric film in the method for manufacturing the semiconductor device according to the present invention.

FIG. 2 shows a time sequence for the pre-thermal treatment step and the thermal treatment step. The thermal treatment step comprises the following eight sub-steps.

(1a) Inert gas, for example, nitrogen gas, is supplied at supply velocity $V_N$=2 slm (standard liter/min; the flow rate per minute at 1 atm and 0° C. expressed in terms of liter). Nitrogen gas is continuously supplied until before sub-step (1h).
(1b) The temperature is raised from the room temperature to Ta=500° C.
(1c) The resultant condition is maintained at Ta=500° C. for T1=5 seconds.
(1d) Oxygen gas as oxidized gas is supplied at supply velocity $V_O$=0.2 slm for T2=3 seconds (a step of oxidizing the dielectric film by supplying an oxidized gas to the dielectric film).
(1e) The supply of oxygen is stopped, and the resultant condition is maintained for T3=7 seconds.
(1f) The process of sub-steps (1d) and (1e) is repeated n=20 times.
(1g) The temperature is lowered to the room temperature.
(1h) The supply of the inert gas is stopped.

In step (1d), oxygen is supplied, and in step (1e), the supply of oxygen is stopped, with the oxygen in the atmosphere exhausted. Two steps (1d) and (1e), corresponding to one cycle, are repeated a plurality of times (in the present exemplary embodiment, 20 times) to carry out an oxidation treatment for one minute.

The duration of the oxidation treatment during time T2 of step (1d) is insufficient to allow the oxidation of the lower electrode to progress. After step (1d), for time T3 in step (1e), the supply of oxygen is stopped, and the oxygen in the atmosphere is exhausted. The exhaust is sufficiently carried out so as to prevent oxygen from remaining in the thermal treatment chamber as the cycle is repeated. The time T3 is preferably set to be longer than the time T2. T2 and T3 are set based on data on the progress of oxidation of the lower electrode examined based on permittivity characteristics and by TEM physical analysis, as well as data on the condition of an oxygen defect examined based on leakage current characteristics.

Plural repetitions of the two steps allow the oxidation treatment for recovery from the oxygen defect in the STO film to be sufficiently carried out while suppressing the progress of oxidation of the lower electrode.

In the present exemplary embodiment, oxidation step (1d) and step (1e) of stopping the supply of oxygen are periodically repeated. However, the repetition need not be periodic.

A dielectric film forming a capacitor in a DRAM is thin and is about 10 nm according to the present exemplary embodiment. To allow the diffusion of oxygen in such a thin film to be controlled, the velocity at which oxygen diffuses in the dielectric film is preferably reduced. The oxygen diffusion velocity can be reduced by decreasing oxygen partial pressure or thermal treatment temperature. The oxygen partial pressure can be adjusted by varying the following parameters: oxygen gas supply velocity $V_O$, nitrogen gas supply velocity $V_N$, and pressure.

The STO film is amorphous before the thermal treatment step. Then, the thermal treatment including the pre-thermal treatment step and the thermal treatment step allows a crystallized area to be formed in the STO film. Specifically, the crystallization is achieved by a plurality of thermal treatment steps including thermal treatment step in (1c) step as well as steps (1d) and (1e). In some case, in (1c) step, the crystallization may be nearly completed.

In this case, if the crystallization is allowed to progress sufficiently during pre-thermal treatment step (1c) in the inert atmosphere before the start of the oxygen supply, treatment time T1 in step (1c) is increased. If pre-thermal treatment step (1c) is carried out to an STO film at 500° C., the treatment time T1 is at least about 30 seconds. The film crystallized in pre-thermal treatment step (1c) is dense and thus effective for delaying oxygen diffusion in subsequent oxidation step (1d). If the dielectric film is so thick that the lower electrode is readily oxidized, the STO film is crystallized before oxidation treatment step (1d). This enables a variation in oxygen diffusion velocity during the oxidation treatment to be inhibited, thus allowing oxidation of the lower electrode to be suppressed.

Oxygen supply time T2, oxygen stop time T3, oxygen gas supply velocity $V_O$, nitrogen gas supply velocity $V_N$, and pressure are determined by the above-described status of oxidation of the lower electrode and the degree of recovery from the oxygen defect in the STO film. That is, the velocity at which the STO film recovers from the oxygen defect is increased by increasing oxygen supply time T2, reducing oxygen stop time T3, increasing oxygen gas supply velocity $V_O$, and reducing nitrogen gas supply velocity $V_N$. On the other hand, in this case, the lower electrode is readily oxidized. Thus, conditions such as oxygen supply time T2, oxygen stop time T3, oxygen gas supply velocity $V_O$, nitrogen gas supply velocity $V_N$, and pressure can be determined with both the velocity at which the STO film recovers from the oxygen defect and oxidation of the lower electrode considered.

The exhaust of the oxygen gas can further be improved by providing a step of vacuuming between steps (1d) and (1e).

Figure 1D:
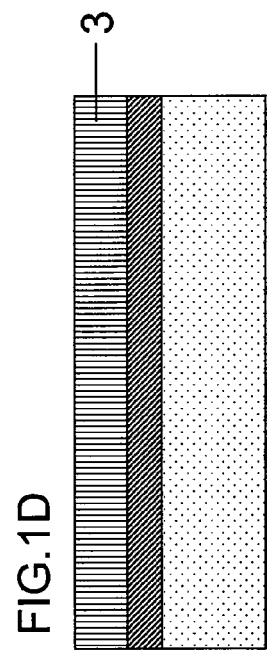
FIG. 1D is a diagram illustrating the example of the method for manufacturing the semiconductor device according to the present invention.

Then, as shown in FIG. 1D, upper electrode 3 serving as a second electrode is formed. Upper electrode 3 is formed of a material unlikely to react with the dielectric film, for example, Ru. Upper electrode 3 is deposited by, for example, the CVD method.

The present exemplary embodiment allows the relative permittivity of the dielectric film to be increased to about 100; the relative permittivity of the dielectric film is 50 when the thermal treatment is carried out in an oxygen atmosphere at 500° C. for 60 seconds. Application of ±1 V to the upper electrode results in a leakage current of $10^{-8}$ A/cm$^2$ or lower, which is an allowable value when the semiconductor device is applied to a DRAM.

In the present exemplary embodiment, when the STO film is formed, an amorphous film is deposited and crystallized by thermal treatment. However, a crystallized STO film may be formed during deposition by, for example, using the CVD method at 400° C. or higher.

The present exemplary embodiment allows the dielectric film to be thermally treated in the oxidized gas atmosphere with the oxidation of the lower electrode or semiconductor substrate suppressed. This allows oxygen to be taken into the dielectric film. The present exemplary embodiment further allows the oxidation of the lower electrode to be suppressed without the conventional need to change the configuration of the film such that the film exhibits oxidation resistance or to add a film of $Al_2O_3$ or the like which exhibits oxidation resistance. The resultant dielectric film has an increased permittivity and suffers a reduced leakage current.

Second Exemplary Embodiment

A method for manufacturing a capacitor element that is a semiconductor device according to a second exemplary embodiment will be described. In the first exemplary embodiment, the oxidation treatment is carried out in the inert gas atmosphere. However, if the thermal treatment using the inert gas is not required, the oxidation treatment can be carried out without the need to supply the inert gas.

Figure 3:
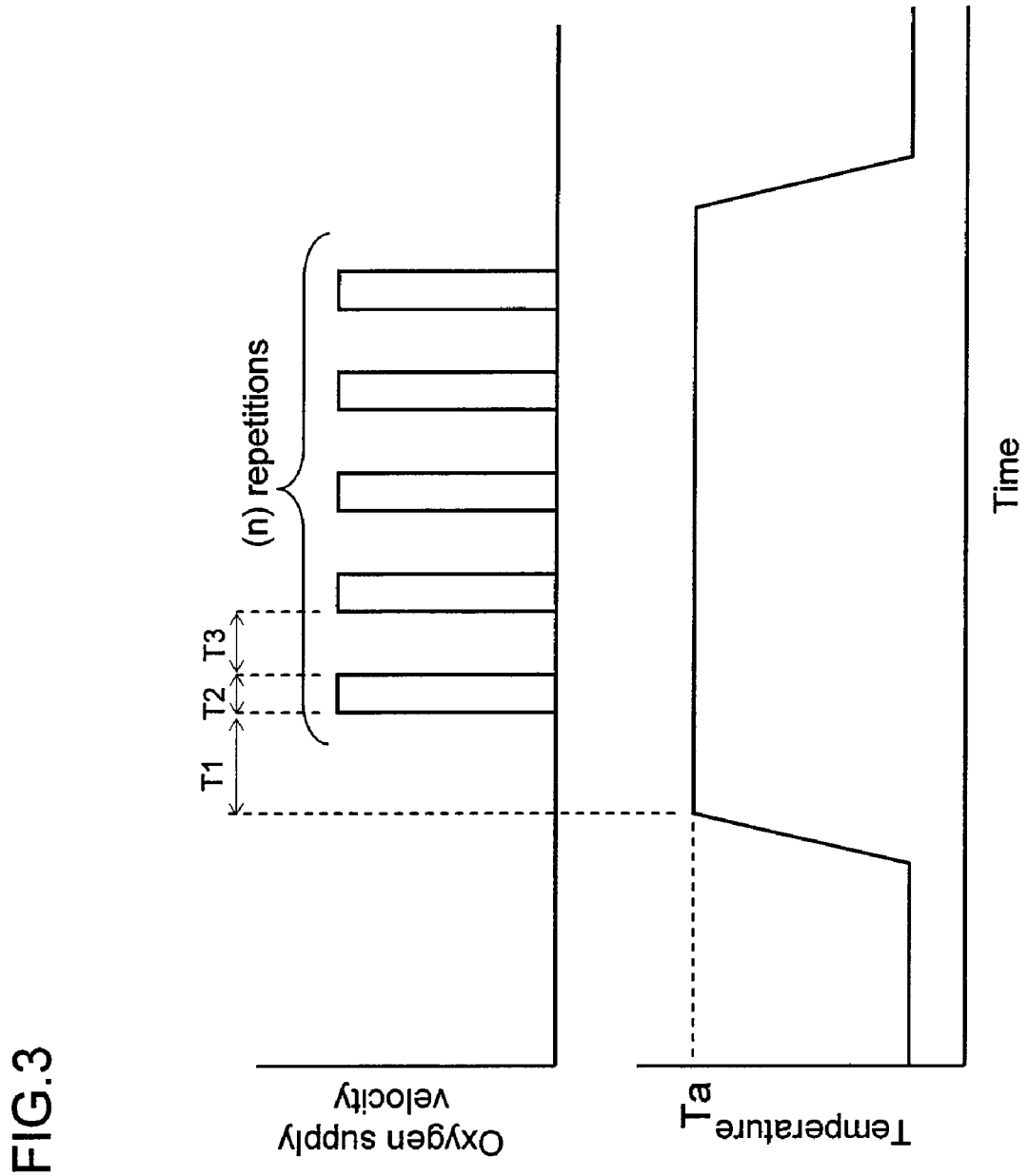
FIG. 3 is a diagram illustrating an example of a step of oxidizing the dielectric film in the method for manufacturing the semiconductor device according to the present invention.

The steps of the manufacturing method according to the first exemplary embodiment shown in FIGS. 1A and 1B are also carried out in the manufacturing method according to the present exemplary embodiment. Furthermore, the time sequence for the pre-thermal treatment step and thermal treatment step for the dielectric film, which corresponds to FIG. 1C, is as shown in FIG. 3. During time T3, the oxygen is kept under reduced pressure.

Thereafter, an upper electrode is formed in the same manner as described in the first exemplary embodiment with reference to FIG. 1D. The present exemplary embodiment eliminates the need to supply the inert gas (nitrogen gas), allowing a reduction in production costs. Furthermore, the oxidation treatment conditions can be controlled by controlling the oxygen gas supply conditions. This eliminates the need to take the adverse effects of the inert gas into account. Thus, the present exemplary embodiment advantageously requires a reduced number of parameters for controlling the oxidation treatment compared to the first exemplary embodiment.

Third Exemplary Embodiment

A manufacturing method according to a third exemplary embodiment will be described. The steps of the manufacturing method according to the first exemplary embodiment shown in FIGS. 1A and 1B are also carried out in the manufacturing method according to the present exemplary embodiment.

Figure 4:
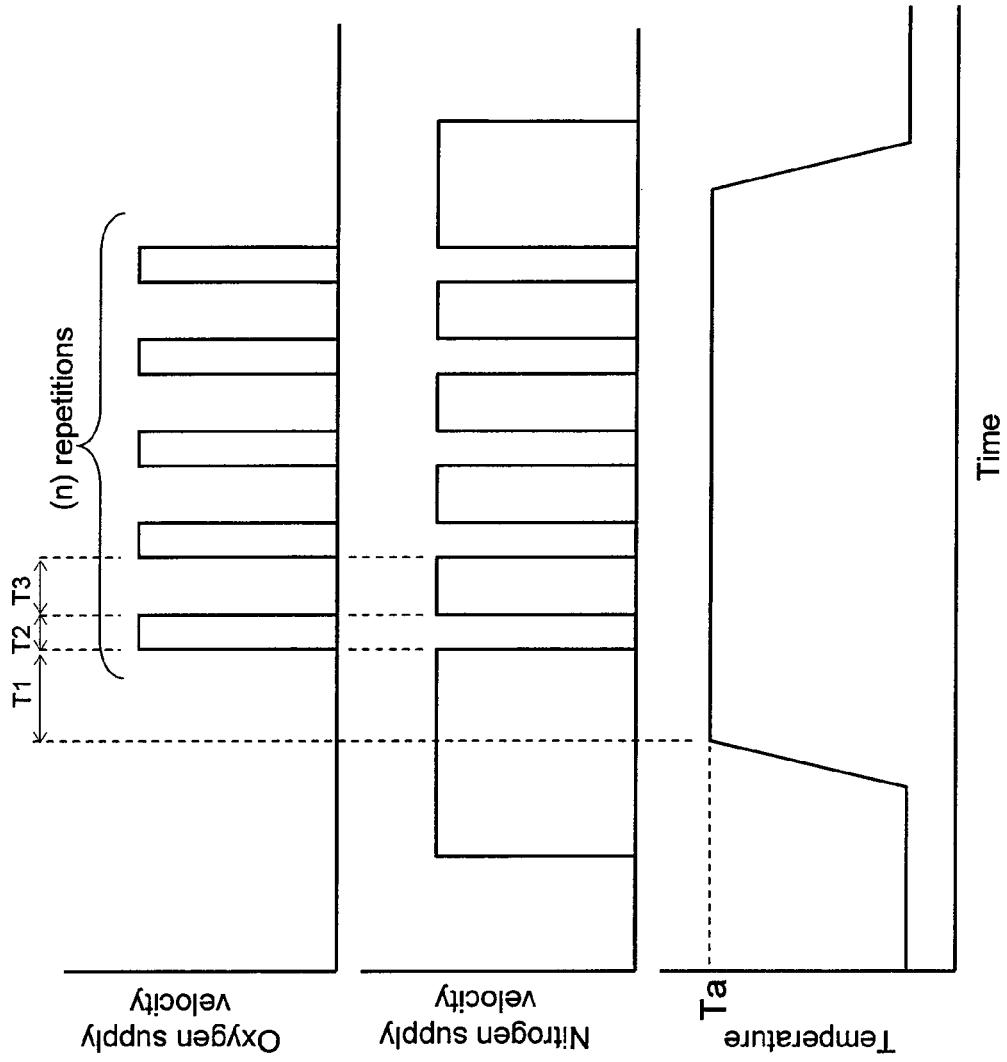
FIG. 4 is a diagram illustrating an example of a step of oxidizing the dielectric film in the method for manufacturing the semiconductor device according to the present invention.

Furthermore, the time sequence for the thermal treatment step for the dielectric film, which corresponds to FIG. 1C, is as shown in FIG. 4. In the present exemplary embodiment, during the supply of oxygen gas, oxygen gas is supplied with the supply of inert gas stopped.

Thereafter, an upper electrode is formed in the same manner as described in the first exemplary embodiment with reference to FIG. 1D. In the present exemplary embodiment, the inert gas conditions may be controlled during the inert thermal treatment, and the oxygen gas supply conditions may be controlled during the oxidation thermal treatment. The oxidation treatment conditions can be controlled by controlling the oxygen gas supply conditions. This eliminates the need to take the adverse effects of the inert gas into account. Thus, the present exemplary embodiment advantageously requires a reduced number of parameters for controlling the oxidation treatment compared to the first exemplary embodiment.

Fourth Exemplary Embodiment

Figure 5:
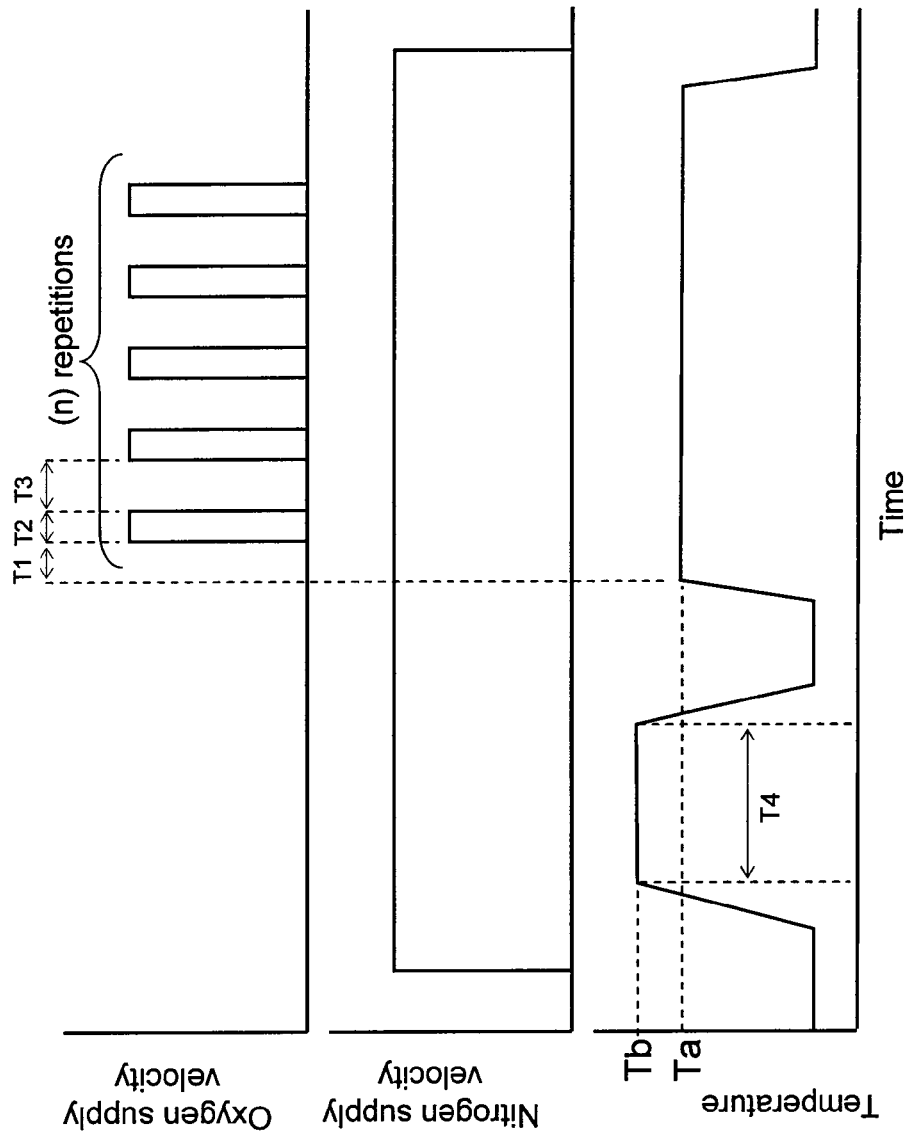
FIG. 5 is a diagram illustrating an example of a step of oxidizing the dielectric film in the method for manufacturing the semiconductor device according to the present invention.

A manufacturing method according to a fourth exemplary embodiment will be described. The steps of the manufacturing method according to the first exemplary embodiment shown in FIGS. 1A and 1B are also carried out in the manufacturing method according to the present exemplary embodiment. The time sequence for the pre-thermal treatment step and thermal treatment step for the dielectric film, which corresponds to FIG. 1C, is as shown in FIG. 5. The thermal treatment comprises 11 sub-steps shown below.

(2a) Inert gas, for example, nitrogen gas, is supplied at supply velocity $V_N$=2 slm. Nitrogen gas is continuously supplied until before sub-step (2k).

(2b) The temperature is raised from the room temperature to Tb=650° C.

(2c) The resultant condition is maintained at Tb=650° C. for T4=10 seconds.

(2d) The temperature is lowered to the room temperature.

(2e) The temperature is raised to Ta=500° C.

(2f) The resultant condition is maintained at Ta=500° C. for T1=5 seconds.

(2g) Oxygen gas as oxidized gas is supplied at supply velocity $V_O$=0.2 slm for T2=3 seconds.

(2h) The supply of oxygen is stopped, and the resultant condition is maintained for T3=7 seconds.

(2i) The process of (2g) and (2h) is repeated n=20 times.

(2j) The temperature is lowered to the room temperature.

(2k) The supply of the inert gas is stopped.

Then, an upper electrode is formed in the same manner as described in the first exemplary embodiment with reference to FIG. 1D. In the thermal treatment method according to the present exemplary embodiment, a part of the crystallization treatment (pre-thermal treatment step) for the amorphous dielectric film immediately after deposition can be carried out at a temperature different from that at which the oxidation treatment after the crystallization is carried out. That is, the crystallization treatment is carried out at a high temperature sufficient for the crystallization. In contrast, the oxidation treatment is carried out at a low temperature at which the oxidation of the lower electrode can be suppressed. The STO film is crystallized at a temperature higher than 500° C., for example, 650° C. Thus, the crystallization is promoted compared to that carried out at 500° C., thus enabling an increase in permittivity. Furthermore, the oxidation treatment is carried out at a low temperature of 500° at which the oxidation of the lower electrode is prevented from progressing.

Furthermore, in the description of the present exemplary embodiment, the temperature is lowered to the room temperature in step (2d). However, the temperature may be lowered from Tb to Ta instead of being lowered to the room temperature. The present exemplary embodiment may be carried out in the same apparatus. However, pre-thermal treatment step (2a) to (2d) and thermal treatment step (2d) to (2k) may be carried out in separate apparatuses.

In the method according to the present exemplary embodiment, the crystallization treatment can be carried out at a high temperature of 650° C., whereas the oxidation treatment can be carried out at a low temperature of 500° C. This enables an increase in permittivity and allows the oxidation of the lower electrode to be suppressed.

A method of applying sub-steps (2a) to (2k) according to the present exemplary embodiment to a $TiO_2$ film will be described below.

A $TiO_2$ film deposited at a low temperature of at most 400° C. has an amorphous or anatase structure. When the $TiO_2$ film is thermally treated at 700° C. or higher, the $TiO_2$ structure changes to a rutile structure. The $TiO_2$ film exhibits a permittivity of 20 to 40 when having the anatase structure. The $TiO_2$ film exhibits a permittivity of 100 when having the rutile structure.

In sub-steps (2a) to (2k), thermal treatment temperature Tb is set to 700° C., and thermal treatment temperature Ta is set to 500° C. This method provides $TiO_2$ of the rutile structure, having a high permittivity, and a dielectric film suffering a reduced leakage current.

Fifth Exemplary Embodiment

Figure 6:
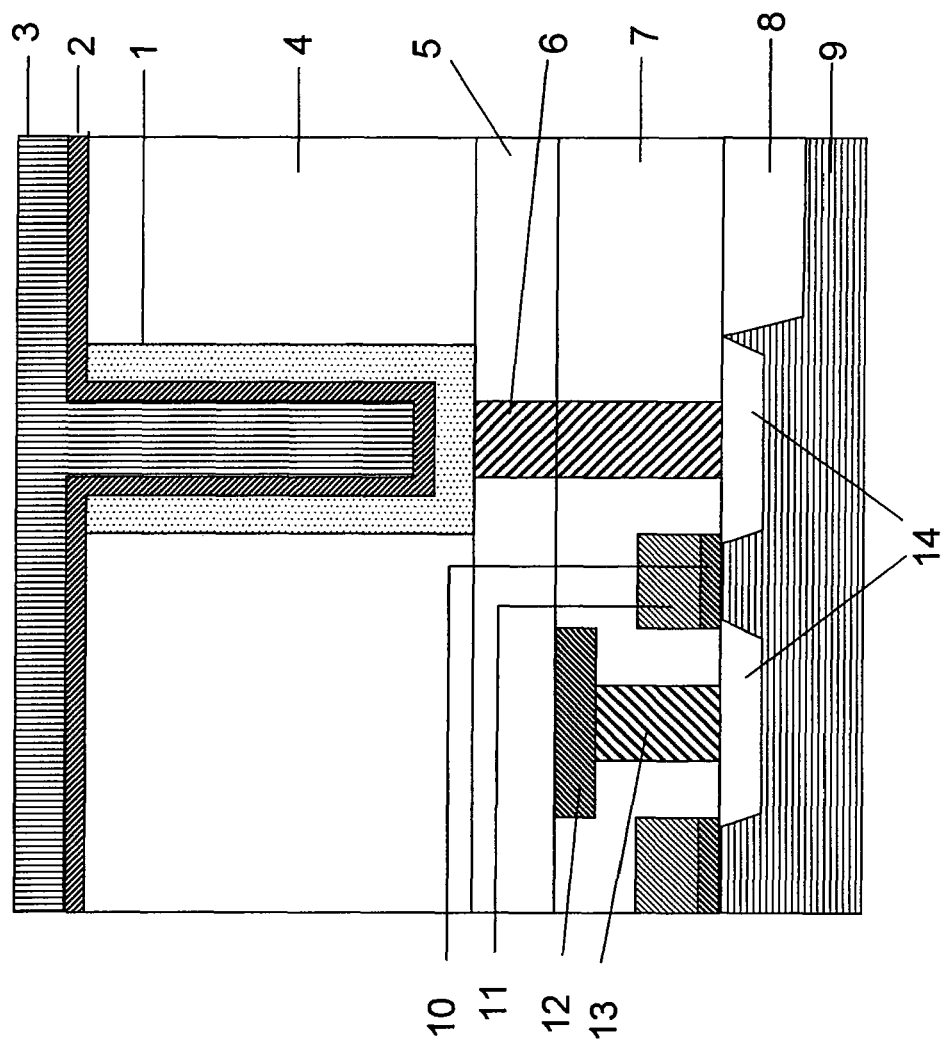
FIG. 6 is a diagram illustrating an example of a semiconductor device manufactured by the method for manufacturing the semiconductor device according to the present invention.

FIG. 6 is a sectional view of a memory cell illustrating a method for manufacturing a memory cell in a DRAM according to a fifth exemplary embodiment.

The manufacturing method according to the fifth exemplary embodiment will be described below. First, isolation region 8 and an element formation region are formed on a semiconductor substrate. A select transistor comprising gate electrode 11 and source/drain region 14 is formed in the element formation region.

Then, first interlayer film 7 is formed so as to cover the select transistor. Bit line contact plug 13 connected to source/drain region 14 of the select transistor is formed so as to penetrate first interlayer film 7. Moreover, bit line 12 connected to bit line contact plug 13 is formed.

Thereafter, second interlayer film 5 is formed on bit line 12. Capacitor contact plug 6 connected to the source/drain region of the select transistor is formed so as to penetrate second interlayer film 5.

Then, capacitor interlayer film 4 is formed on capacitor contact plug 6. A lithography technique and a dry etching technique are used to form an opening extending upward from the top surface of the capacitor contact plug through capacitor interlayer film 4.

Thereafter, the interior of the opening is coated from the top surface of capacitor interlayer film 4 with a film having a film thickness insufficient to fill the opening, to deposit a first conductive film connected to the capacitor contact plug. A material for the first conductive film is, for example, Ru. The first conductive film is preferably deposited by the CVD or ALD method, which is excellent in step coverage.

A CMP technique or a dry etching technique is used to remove the first conductive film located on the capacitor interlayer film, with the first conductive film left inside the opening. Thus, recessed lower electrode 1 is formed.

Then, dielectric film 2 is formed on lower electrode 1. For example, an STO film is used as dielectric film 2. The deposition is preferably carried out by the CVD or ALD method, which is excellent in step coverage. Dielectric film 2 is thermally treated by the method shown in the first to fifth exemplary embodiments.

Then, upper electrode 3 comprising a second conductive film is formed on dielectric film 2. For example, an Ru film is used as the second conductive film. The deposition is preferably carried out by the thermal CVD or ALD method, which is excellent in step coverage.

In the present exemplary embodiment, lower electrode 1 is shown to have a recessed cylindrical capacitor structure. However, the capacitor structure may be shaped like a crown, a plane, a box, or the like. The structure of the capacitor is determined by a capacitance value required for the device.

A dielectric film of an oxygen compound can be used as dielectric film 2 of the capacitor according to the present exemplary embodiment. Furthermore, the present exemplary embodiment has been described in conjunction with the DRAM in which the oxygen compound is used in a capacitor. However, the present exemplary embodiment is applicable to, for example, a ferroelectric memory (FRAM) in which the oxygen compound is used in a capacitor and a resistance change memory (RRAM) in which the oxygen compound is used in a resistance change element.

For the FRAM, $Pb(Zr, Ti)O_3$, $SrBi_2Ta_2O_9$, $Bi_4Ti_3O_{12}$, or the like is used as a dielectric film. For the RRAM, an oxygen compound such as $HfO_2$, $ZrO_2$, or STO is used as a dielectric film.

Sixth Exemplary Embodiment

Figure 7:
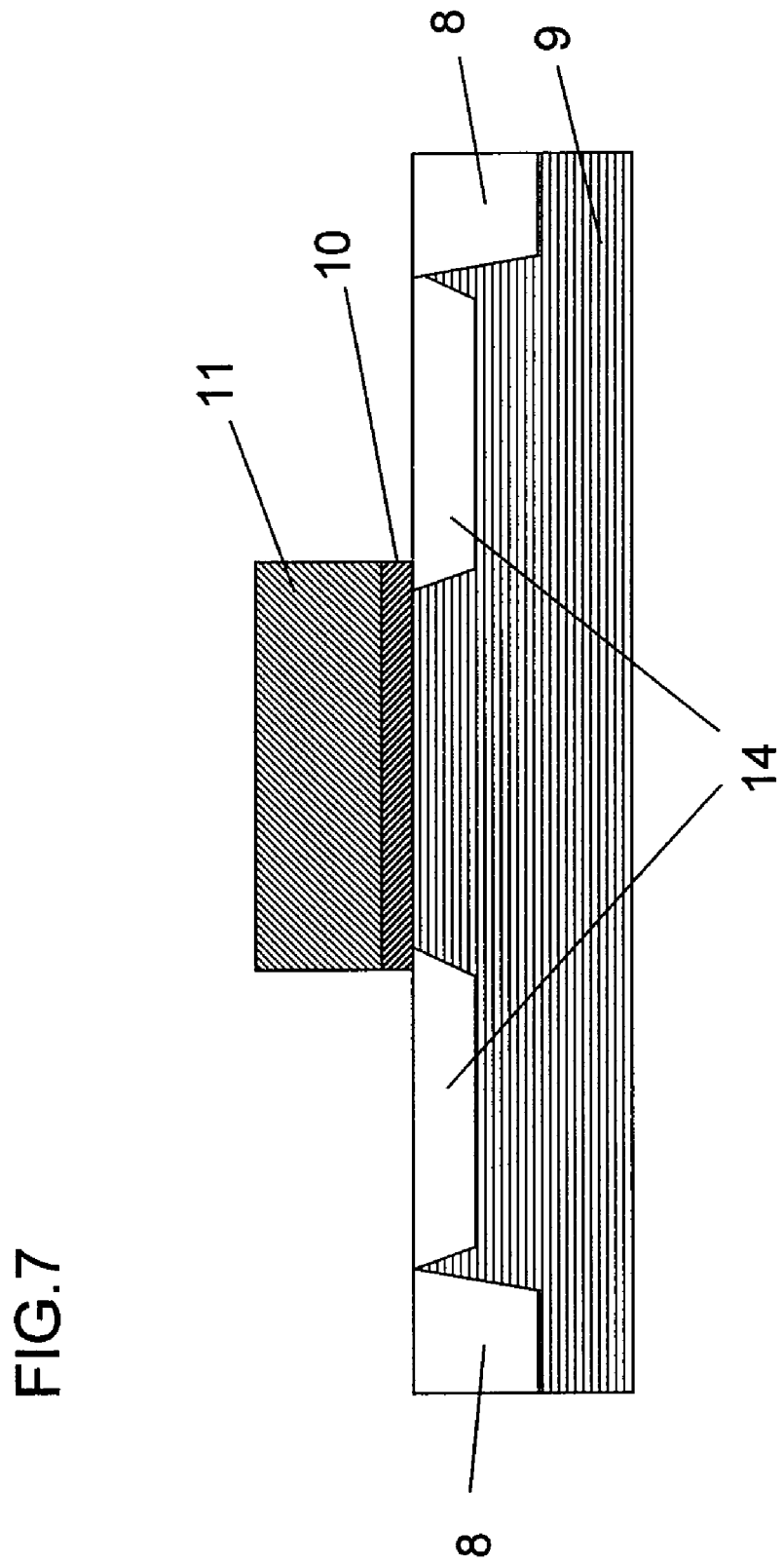
FIG. 7 is a diagram illustrating an example of a semiconductor device manufactured by the method for manufacturing the semiconductor device according to the present invention.

FIG. 7 is a sectional view of a MOS transistor illustrating a method for manufacturing the MOS transistor according to a sixth exemplary embodiment. This method for manufacturing is described below.

First, isolation region 8 and an element formation region are formed on semiconductor substrate 9, for example, a silicon substrate. A semiconductor material such as germanium may be used as semiconductor substrate 9.

Then, ions are implanted in semiconductor substrate 9 so as to allow a threshold for the transistor to be controlled. Dielectric film 10 as a gate insulating film is grown on semiconductor substrate 9. Dielectric film 10 may be formed of a material that does not react with the silicon substrate during a high-temperature thermal treatment step for formation of the transistor in which, for example, a source/drain region is activated. The material is, for example, HfSiON. Alternatively, a silicate film, an aluminate film, or a high dielectric-constant film may be used as a material for dielectric film 10. Dielectric film 10 is grown by, for example, the CVD method.

Then, dielectric film 10 is thermally treated using any of the methods described in the first to fifth exemplary embodiments.

Thereafter, gate electrode 11 is formed. Gate electrode 11 may be formed of a material that does not react with the gate insulating film during a high-temperature thermal treatment step for formation of the transistor in which, for example, the source/drain region is activated. The material for gate electrode 11 is, for example, TiN.

Then, gate electrode 11 is patterned. Impurity ions are implanted on the semiconductor substrate in a self-aligned manner with respect to the gate electrode. Source/drain region 14 is thus formed.

Variations of the First to Sixth Exemplary Embodiments

The material for the dielectric film applicable to the first to sixth exemplary embodiments is not limited to those described above. Other possible materials for the dielectric film include, for example, an oxygen compound containing Hf, Zr, Al, La, Ce, Y, Ti, Nb, Pr, Ta, or Bi, oxygen compounds such as $HfO_2$, $ZrO_2$, $Al_2O_3$, $La_2O_3$, $CeO_2$, $Y_2O_3$, $TiO_2$, $Nb_2O_5$, $Pr_2O_3$, $Ta_2O_5$, HfSiO, HfSiON, ZrSiO, HfAlO, ZrAlO, $SrTiO_3$, $(Ba, Sr)TiO_3$, $Pb(Zr, Ti)O_3$, $SrBi_2Ta_2O_9$, and $Bi_4Ti_3O_{12}$, and a stack film of any of these oxygen compounds.

The above-described first to sixth exemplary embodiments are not limited to the above-described method for depositing the dielectric film. The ALD or CVD method, a sputtering method, or a sol-gel process may be applied.

In the above-described first to sixth exemplary embodiment, the oxidized gas used in the thermal treatment step is not limited to that described above. The oxidized gas may be a gas containing $O_2$, $O_3$, NO, $NO_2$, $N_2O$, or $H_2O$ or a combination of a plurality of these gases.

In the above-described first to sixth exemplary embodiments, the step of supplying the oxidized gas may include a step of stopping the supply of the oxidized gas and then exhausting the oxygen by vacuuming. This allows the oxygen gas to be more appropriately exhausted.

In the above-described first to sixth exemplary embodiments, the inert gas used in the thermal treatment step is not limited to that described above. The inert gas may be $N_2$, He, Ar, or a combination of a plurality of these gases.

In the above-described first to sixth exemplary embodiments, the apparatus used in the pre-thermal treatment step and the thermal treatment step is not limited to the above-described thermal treatment apparatuses. The thermal treatment apparatus may be a rapid thermal processing apparatus, an ALD apparatus, a CVD apparatus, or an electric furnace.

In the above-described first to sixth exemplary embodiments, the materials for the lower electrode, the upper electrode, and the gate electrode are not limited to the above-described electrode materials. For example, the electrode material may be TiN, Ti, Ta, TaN, Zr, Ir, IrN, IrO, W, WN, Ru, RuO, Pt, silicon, impurity doped poly-silicon, or a combination of a plurality of these materials. In particular, Ru, TiN, Ti, Ir, W, and WN, which allow the electrode to be readily oxidized, enable the effects of the present invention to be significantly exerted.

In the examples shown in the above-described first to sixth exemplary embodiments, the dielectric film is crystallized as a result of the thermal treatment. However, the dielectric film may be amorphous after the thermal treatment.

The first to sixth exemplary embodiments have been described in conjunction with the memory such as a DRAM, a FRAM, or an RRAM, and the MOS transistor. However, the present invention is not limited to these and is applicable to any thin film formed on the lower electrode.

It is apparent that the present invention is not limited to the above embodiments, but may be modified and changed without departing from the scope and spirit of the invention.

What is claimed is:

1. A method for manufacturing a semiconductor device, the method comprising:
   forming a lower electrode;
   forming a dielectric film on the lower electrode;
   oxidizing the dielectric film on the lower electrode by supplying an oxidized gas to an exposed surface of the dielectric film intermittently a plurality of times at a heat treatment; and
   forming an upper electrode on the dielectric film.

2. The method for manufacturing a semiconductor device according to claim 1,
   wherein the lower electrode and the upper electrode contain at least one material selected from a group consisting of TiN, Ti, TaN, Ta, Zr, IrN, Ir, $IO_2$, WN, W, Ru, $RuO_2$, $SrRuO_3$, Pt, impurity doped poly-silicon, and silicon.

3. The method for manufacturing a semiconductor device according to claim 1, before forming the lower electrode, further comprising:
   forming a field effect transistor;
   forming a bit contact plug and a bit line in such a manner that the bit contact plug and the bit line are electrically connected to one of a source region and a drain region of the field effect transistor; and
   forming a capacitor contact plug in such a manner that the capacitor contact plug is electrically connected to the other of the source region and the drain region of the field effect transistor,
   wherein in forming the lower electrode, the lower electrode is formed so as to be electrically connected to the capacitor contact plug.

4. A method for manufacturing a semiconductor device, the method comprising:
   forming a dielectric film on a semiconductor substrate; and
   oxidizing the dielectric film by supplying an oxidized gas to an exposed surface of the dielectric film intermittently a plurality of times at a heat treatment.

5. The method for manufacturing a semiconductor device according to claim 4, after oxidizing the dielectric film, further comprising:
   forming a gate electrode on the dielectric film; and
   forming a source region and a drain region on respective opposite sides of the gate electrode in the semiconductor substrate,
   wherein the dielectric film is formed as a gate insulating film, and the semiconductor device is formed as a field effect transistor.

6. The method for manufacturing a semiconductor device according to claim 1,
   wherein oxidizing the dielectric film comprises repeating steps of (1) and (2) a plurality of times:
   (1) supplying the dielectric film with oxidized gas during a first time; and
   (2) supplying the dielectric film with inert gas during a second time.

7. The method for manufacturing a semiconductor device according to claim 6,
   wherein the second time is longer than the first time.

8. The method for manufacturing a semiconductor device according to claim 6,
   wherein the inert gas is at least one type of gas selected from a group consisting of $N_2$, He, Ar, and Ne.

9. The method for manufacturing a semiconductor device according to claim 1,
wherein in forming the dielectric film, an amorphous dielectric film is formed, and then the amorphous dielectric film is converted into a dielectric film containing a crystallized layer.

10. The method for manufacturing a semiconductor device according to claim 9,
wherein the dielectric film is an $SrTiO_3$ film, and
oxidizing the dielectric film is carried out at 400° C. or higher.

11. The method for manufacturing a semiconductor device according to claim 1, further comprising carrying out pre-thermal treatment in an inert gas atmosphere after forming the dielectric film and before firstly supplying the oxidized gas.

12. The method for manufacturing a semiconductor device according to claim 4, further comprising carrying out pre-thermal treatment in an inert gas atmosphere after forming the dielectric film and before firstly supplying the oxidized gas.

13. The method for manufacturing a semiconductor device according to claim 1,
wherein the oxidized gas is at least one gas selected from a group consisting of $O_2$, $O_3$, $H_2O$, NO, and $N_2O$.

14. The method for manufacturing a semiconductor device according to claim 1,
wherein the dielectric film contains at least one type of element selected from a group consisting of Hf, Zr, Al, La, Ce, Y, Ti, Nb, Pr, Ta, and Bi.

15. The method for manufacturing a semiconductor device according to claim 1,
wherein the dielectric film contains at least one material selected from a group consisting of $HfO_2$, $ZrO_2$, $Al_2O_3$, $La_2O_3$, $CeO_2$, $Y_2O_3$, $TiO_2$, $Nb_2O_5$, $Pr_2O_3$, $Ta_2O_5$, HfSiO, HfSiON, ZrSiO, HfAlO, ZrAlO, $SrTiO_3$, $(Ba,Sr)TiO_3$, $Pb(Zr, Ti)O_3$, $SrBi_2Ta_2O_9$, and $Bi_4Ti_3O_{12}$.

16. The method for manufacturing a semiconductor device according to claim 1,
wherein oxidizing the dielectric film comprises repeating following steps of (3) and (4) a plurality of times while the dielectric film is subjected to heat treatment:
(3) supplying the oxidized gas into an inert gas atmosphere during a third time; and
(4) stopping the oxidized gas supply into the inert gas atmosphere during a fourth time.

17. The method for manufacturing a semiconductor device according to claim 16,
wherein the third time is set such that the lower electrode is prevented from oxidizing.

18. The method for manufacturing a semiconductor device according to claim 1,
wherein none of a metal or semimetal film is formed on the exposed surface of the dielectric film when the oxidized gas is supplied.

19. The method for manufacturing a semiconductor device according to claim 4,
wherein none of a metal or semimetal film is formed on the exposed surface of the dielectric film when the oxidized gas is supplied.

20. The method for manufacturing a semiconductor device according to claim 12,
wherein a temperature at the heat treatment is different from a temperature at the pre-thermal treatment.

* * * * *